(12) United States Patent
Perzlmaier et al.

(10) Patent No.: US 10,411,064 B2
(45) Date of Patent: Sep. 10, 2019

(54) OPTOELECTRONIC COMPONENT AND A METHOD OF PRODUCING AN OPTOELECTRONIC COMPONENT WITH ESD PROTECTION

(71) Applicant: OSRAM Opto Semiconductors GmbH, Regensburg (DE)

(72) Inventors: Korbinian Perzlmaier, Regensburg (DE); Christian Leirer, Friedberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/743,578

(22) PCT Filed: Jul. 12, 2016

(86) PCT No.: PCT/EP2016/066526
§ 371 (c)(1),
(2) Date: Jan. 10, 2018

(87) PCT Pub. No.: WO2017/009332
PCT Pub. Date: Jan. 19, 2017

(65) Prior Publication Data
US 2018/0204876 A1 Jul. 19, 2018

(30) Foreign Application Priority Data
Jul. 16, 2015 (DE) .......... 10 2015 111 558

(51) Int. Cl.
*H01L 27/15* (2006.01)
*H01L 33/62* (2010.01)
(Continued)

(52) U.S. Cl.
CPC .......... *H01L 27/15* (2013.01); *H01L 33/0079* (2013.01); *H01L 33/08* (2013.01);
(Continued)

(58) Field of Classification Search
CPC ....... H01L 27/15; H01L 33/382; H01L 33/62; H01L 33/08
See application file for complete search history.

(56) References Cited

U.S. PATENT DOCUMENTS

2004/0080941 A1* 4/2004 Jiang .................. H01L 24/18
362/84
2005/0274956 A1* 12/2005 Bhat ................... H01L 27/15
257/79
(Continued)

FOREIGN PATENT DOCUMENTS

| DE | 10 2012 215 524 A1 | 3/2014 |
|---|---|---|
| DE | 10 2012 110 909 A1 | 5/2014 |
| WO | 2014/187164 A1 | 11/2014 |

*Primary Examiner* — Allen L Parker
*Assistant Examiner* — Gustavo G Ramallo
(74) *Attorney, Agent, or Firm* — DLA Piper LLP (US)

(57) ABSTRACT

A component includes a carrier with a mold body made of an electrically insulating plastic material and a metal layer, wherein the metal layer includes a first subregion and a second subregion, and at least one of the subregions extends in a vertical direction through a mold body to electrically contact a semiconductor body, and the first and second segments are spatially separated from one another in a lateral direction and electrically conductively connect to one another via a connecting structure, wherein the connecting structure, the first subregion and the second subregion adjoin the mold body and are arranged on the same side of the semiconductor body.

17 Claims, 6 Drawing Sheets

(51) Int. Cl.
  *H01L 33/08*  (2010.01)
  *H01L 33/00*  (2010.01)
  *H01L 33/38*  (2010.01)
  *H01L 33/54*  (2010.01)
  *H01L 33/20*  (2010.01)

(52) U.S. Cl.
  CPC ............ *H01L 33/382* (2013.01); *H01L 33/54* (2013.01); *H01L 33/62* (2013.01); *H01L 33/20* (2013.01); *H01L 2933/005* (2013.01); *H01L 2933/0066* (2013.01)

(56) References Cited

U.S. PATENT DOCUMENTS

| | | | |
|---|---|---|---|
| 2005/0280016 A1* | 12/2005 | Mok | H01L 33/56 257/99 |
| 2006/0113548 A1 | 6/2006 | Chen et al. | |
| 2013/0214247 A1* | 8/2013 | Hu | H01L 27/156 257/13 |
| 2014/0175471 A1 | 6/2014 | Akimoto et al. | |
| 2014/0183444 A1* | 7/2014 | Chen | H01L 33/62 257/13 |
| 2015/0243857 A1 | 8/2015 | Sabathil et al. | |
| 2017/0025580 A1 | 1/2017 | Huang et al. | |
| 2017/0071042 A1* | 3/2017 | Song | H05B 33/0845 |
| 2017/0330981 A1* | 11/2017 | Hoeppel | H01L 33/382 |

\* cited by examiner

OPTOELECTRONIC COMPONENT AND A METHOD OF PRODUCING AN OPTOELECTRONIC COMPONENT WITH ESD PROTECTION

TECHNICAL FIELD

This disclosure relates to an optoelectronic component and a method of producing one or a plurality of optoelectronic components.

BACKGROUND

Light-emitting diode chips such as sapphire chips have a high sensitivity to electrostatic discharges. To protect light-emitting diode chips from electrostatic discharges, protective diodes have been used that are produced separately from the light-emitting diode chip and connected to the light-emitting diode chip in an anti-parallel manner. To operate the light-emitting diode chips with a high operating voltage, in general, a plurality of separate light-emitting diode chips are connected to one another in series.

There is nonetheless a need to provide an improved optoelectronic component which can be produced in a simplified manner and is of compact construction as well as to provide a cost-effective method of producing one or a plurality of such components.

SUMMARY

We provide a component including a carrier and a semiconductor body arranged on the carrier, wherein the semiconductor body has at least a first segment and a second segment, and the segments are constructed in the same manner and each have a first semiconductor layer facing away from the carrier, a second semiconductor layer facing towards the carrier, and an active layer arranged in a vertical direction between the first and the second semiconductor layers, the carrier includes a mold body made of an electrically insulating plastic material and a metal layer, wherein the metal layer includes a first subregion and a second subregion, and at least one of the subregions extends in the vertical direction through the mold body to electrically contact the semiconductor body, and the first and second segments are spatially separated from one another in a lateral direction and electrically conductively connect to one another via a connecting structure, wherein the connecting structure, the first subregion and the second subregion adjoin the mold body and are arranged on the same side of the semiconductor body.

We also provide a method of producing one or a plurality of the components including a carrier and a semiconductor body arranged on the carrier, wherein the semiconductor body has at least a first segment and a second segment, and the segments are constructed in the same manner and each have a first semiconductor layer facing away from the carrier, a second semiconductor layer facing towards the carrier, and an active layer arranged in a vertical direction between the first and the second semiconductor layers, the carrier includes a mold body made of an electrically insulating plastic material and a metal layer, wherein the metal layer includes a first subregion and a second subregion, and at least one of the subregions extends in the vertical direction through the mold body to electrically contact the semiconductor body, and the first and second segments are spatially separated from one another in a lateral direction and electrically conductively connect to one another via a connecting structure, wherein the connecting structure, the first subregion and the second subregion adjoin the mold body and are arranged on the same side of the semiconductor body, wherein the carrier is formed on the semiconductor body and not produced separately from the semiconductor body.

We further provide a component including a carrier and a semiconductor body arranged on the carrier, wherein the semiconductor body has at least a first segment and a second segment, and the segments are constructed in the same manner and each have a first semiconductor layer facing away from the carrier, a second semiconductor layer facing towards the carrier, and an active layer arranged in a vertical direction between the first and the second semiconductor layers, the carrier includes a mold body made of an electrically insulating plastic material and a metal layer, wherein the metal layer includes a first subregion and a second subregion, and at least one of the subregions extends in the vertical direction through the mold body to electrically contact the semiconductor body, the first and second segments are spatially separated from one another in a lateral direction and electrically conductively connect to one another via a connecting structure, and the connecting structure, the first subregion and the second subregion adjoin the mold body and are arranged on the same side of the semiconductor body, the semiconductor body has a separating trench arranged between the segments, wherein the connecting structure laterally bridges the separating trench and fills the separating trench at least in places, in lateral directions, the mold body surrounds the first subregion and the second subregion completely, and the connecting structure, the first subregion and the second subregion are held together by the mold body such that the connecting structure is formed as an integral part of the carrier and contributes to the mechanical stabilization of the component.

BRIEF DESCRIPTION OF THE DRAWINGS

FIGS. 1A to 3A show schematic illustrations of different examples of a component in sectional views.

LIST OF REFERENCE NUMERALS

100 Component
110 Side surface of the component
101 Radiation passage area
102 Rear side of the component
1 Carrier
10 Side surface of the carrier
2 Semiconductor body
21 First semiconductor layer
22 Second semiconductor layer
23 Active layer
24 Buffer layer
201 First main surface of the semiconductor body
202 Second main surface of the semiconductor body
210 First segment of the semiconductor body
220 Second segment of the semiconductor body
230 Separating trench
4 Metal layer
41 First subregion of the metal layer
42 Second subregion of the metal layer
43 Connecting structure 410 First contact layer
420 Second contact layer
5 Mold body
8 Wiring structure
81 Through-via
82 Connection layer
83 Subregion of the connecting structure
9 Insulating structure
91 Passivation layer

DETAILED DESCRIPTION

Our component may comprise a carrier and a semiconductor body arranged on the carrier. The carrier has a front side facing the semiconductor body and a rear side facing away from the semiconductor body. In particular, the carrier is produced directly on the semiconductor body. This means that the carrier is not produced, for instance, in a production step separate from the semiconductor body and is subsequently fixed to the semiconductor body, but is applied directly onto the semiconductor body and thus is produced directly on the semiconductor body. The carrier comprises, in particular, a mold body formed, for example, as a casted body. For example, the mold body is formed by a casting method. In particular in this case, the semiconductor body is cast with a plastic material such as a castable polymer, for example, a resin, epoxide or silicone.

A casting method means a method by which a molding compound can be formed according to a predefined shape and, if necessary, cured. In particular, the term "casting method" includes molding, film-assisted molding, injection molding, transfer molding and compression molding.

The semiconductor body has a first main surface facing away from the carrier and a second main surface facing towards the carrier. In particular, the main surfaces delimit the semiconductor body in the vertical direction. A vertical direction means a direction directed in particular perpendicular to a main plane of extension of the semiconductor body. In particular, the vertical direction is the growth direction of the semiconductor layers of the semiconductor body. A lateral direction means a direction extending for instance parallel to the main plane of extension of the semiconductor body. In particular, the vertical direction and the lateral direction are directed transversely, for instance perpendicular to one another.

In particular, the semiconductor body comprises a first semiconductor layer facing away from the front side of the carrier, a second semiconductor layer facing towards the front side of the carrier and an active layer arranged between the first and the second semiconductor layers in the vertical direction. During operation of the component, the active layer is preferably configured to generate or detect electromagnetic radiation. For example, the active layer is a p-n junction zone that can be formed as one layer or as a layer sequence of a plurality of layers.

The active layer is configured, in particular, to emit electromagnetic radiation, for instance in the visible, ultraviolet or infrared spectral ranges, or to absorb electromagnetic radiation and convert the same into electrical signals or electrical energy. The semiconductor body can be applied in layers to a growth substrate by an epitaxy method. The growth substrate, however, can be removed from the semiconductor body in a subsequent method step so that the component is in particular free of a growth substrate.

The carrier may comprise a metal layer. The metal layer includes, for example, a first subregion and a second subregion laterally spaced apart from the first subregion. The metal layer is configured to electrically contact the semiconductor body. In this case, at least one of the subregions can extend throughout the mold body in the vertical direction to electrically contact the semiconductor body, in particular as far as the front side of the carrier. In particular, all subregions of the metal layer can extend throughout the mold body in the vertical direction, in particular from the rear side of the carrier to the front side of the carrier.

Expediently, the first subregion and the second subregion of the metal layer are associated with different electrical polarities of the component. The first subregion can be configured to electrically contact the first semiconductor layer and the second subregion to electrically contact the second semiconductor layer, or vice versa.

The front side and the rear side of the carrier can each be formed at least in places by surfaces of the mold body and in places by surfaces of the metal layer, in particular of the subregions of the metal layer. The subregions of the metal layer can be formed to be electrically connectable on the rear side of the carrier. In this case, the subregions of the metal layer can be exposed on the rear side of the carrier or can each be partially or completely covered by an electrically conductive, preferably solderable contact layer.

The semiconductor body may be segmented. In particular, the semiconductor body of the component comprises at least a first segment and a second segment. The semiconductor body can also be subdivided into a plurality of first segments and a plurality of second segments or of further segments. The segments of the semiconductor body can be laterally spaced apart from one another or mechanically connected by a layer of the semiconductor body, wherein the layer is formed to be electrically insulating at least with respect to the lateral direction.

In particular, the semiconductor body comprises a separating trench arranged for instance between the segments of the semiconductor body. In this case, the trench can be formed such that the trench extends in the vertical direction at least through a semiconductor layer, for instance through the first and/or second semiconductor layers/layer, and through the active layer. The semiconductor body can comprise a plurality of such separating trenches. As a result of the segmentation of the semiconductor body, the semiconductor body thus comprises a plurality of segments which—for instance without any further electrical connecting means—are electrically isolated from one another.

The segments of the semiconductor body may be constructed in the same manner. Being constructed in the same manner means that the segments have in particular the same sequence of semiconductor layers along the vertical direction. The segments can have an identical vertical height. An identical vertical height means the same height that can be achieved within the manufacturing tolerances, for instance during epitaxial deposition or after roughening of the semiconductor body. The segments constructed in the same manner and having an identical vertical height can be formed, for example, by lateral structuring of a contiguous semiconductor body or semiconductor layer stack, which is formed in particular in one piece. Such semiconductor body or semiconductor layer stack can be formed, for example, on a growth substrate by a coating method.

The component may comprise a connecting structure. The connecting structure connects for instance two adjacent segments to one another electrically. In this case, the connecting structure can be configured such that it laterally bridges the separating trench arranged between the adjacent segments. This means that, in a plan view, the connecting structure overlaps for instance with the two adjacent segments. The connecting structure can be arranged on the same side on the semiconductor body as the subregions of the metal layer. In a plan view of the rear side of the carrier, the connecting structure, the first subregion and the second subregion are spatially separated in the lateral direction and, in a plan view, can be free of overlaps. For example, the connecting structure and the subregions adjoin the mold body in the lateral direction. In lateral directions, the mold body can surround the connecting structure, the first subregion and/or the second subregion completely. It is also possible for the connecting structure to adjoin the first subregion or the second subregion or to be formed as part of one of the subregions.

The component may comprise a carrier and a semiconductor body arranged on the carrier. The semiconductor body comprises at least one first segment and one second segment, wherein the segments are constructed in the same manner and each comprise a first semiconductor layer facing away from the carrier, a second semiconductor layer facing towards the carrier and an active layer arranged between the first and second semiconductor layers in the vertical direction. The carrier contains a mold body made of an electrically insulating plastic material and a metal layer, wherein the metal layer comprises a first subregion and a second subregion, wherein, to electrically contact the semiconductor body, at least one of the subregions extends throughout the mold body in the vertical direction. The first and second segments are spatially separated from one another in the lateral direction and electrically conductively connect to one another via a connecting structure, wherein the connecting structure, the first subregion and the second subregion adjoin the mold body. Furthermore, they can be arranged on the same side of the semiconductor body.

Such a component having a carrier and a segmented semiconductor body arranged thereon can be produced in a simplified manner on wafer level, for example, in a wafer composite. Due to processing in a wafer composite, it is inter alia not necessary for the carriers of the components to be produced separately and not necessary for the semiconductor bodies to be applied and electrically connected to such separately produced carriers. Such mounting steps with regard to individual chip-processes such as pick & place that require a considerable proportion of the overall production costs of components, can thus be waived, as a result of which the components can be produced in a cost-effective manner. Segmentation of the individual semiconductor body can also be carried out simultaneously during formation of the semiconductor bodies from a semiconductor layer stack such that for instance only one additional photo-layer is required for segmentation of the individual semiconductor body.

The electrical interconnection between various segments of the semiconductor body is preferably carried out before or during the production of the carrier. The segments of the semiconductor body can be connected to one another in series, in parallel or in antiparallel, for example, via the connecting structure or via a plurality of connecting structures. The connecting structures can be in the form of independent layers spatially separated from the subregions, or each adjoin one of the subregions. It is also possible for the connecting structures to be present in the form of conductor tracks that electrically connect together, for example, electrical connections being for instance in the form of connection layers or through-vias of different segments. It is also possible for the connecting structure to be formed as part of one subregion of the metal layer. In this case, the subregion comprising the connecting structure can have overlaps with at least two, in particular adjacent segments of the semiconductor body.

In serial interconnection of the segments, the component can be configured as a high-voltage chip or as a high-voltage LED, as a result of which the component can be operated at a comparatively high operating voltage for instance without a ballast unit, for example, of 3 V to 350 V, for instance 5 V to 12 V, 5 V to 24 V or 5 V to 50 V or 24 V to 250 V, as a result of which a forward voltage and thus also the efficiency of the component can be increased advantageously. In an anti-parallel interconnection of two segments of the semiconductor body, during operation of the component one segment can serve as an ESD protective diode for the other segment, as a result of which the component is particularly compact and furthermore particularly insensitive to electrostatic discharges. In particular, all segments each have a p-n junction zone having a forward-biased direction and a reverse-biased direction. This means that the segments can each be run as an independent diode. In particular, the segments are based on GaN.

The mold body may be contiguous, in particular formed in one piece. The mold body can be formed in a single method step, for example, by a casting method. In this case, it is possible that a mold body composite is first formed on a semiconductor layer stack and together with the semiconductor layer stack thus forms a composite, wherein the composite can be singulated into a plurality of components, each of which has for instance a contiguous and one-piece mold body, wherein the semiconductor body and the mold body of the respective component arise from the semiconductor layer stack and from the mold body composite, respectively, during singulation of the composite. The separated components can each have a carrier made of a mold body and a metal layer, wherein the metal layer contains in particular subregions. The carrier can also have a connecting structure configured to electrically interconnect the segments. The subregions of the metal layer and the connecting structure can be held together by the mold body, as a result of which a particularly compact and mechanically stable carrier is formed.

The mold body and the connecting structure may be formed such that the rear side of the mold body facing away from the semiconductor body is free from a surface of the connecting structure. In this case, the connecting structure can be applied to the semiconductor body prior to formation of the mold body.

The active layer of the first segment and the active layer of the second segment may each be formed as a p-n junction zone, wherein the first segment and the second segment electrically interconnect in series via the connecting structure. A semiconductor layer of a first charge carrier type of a segment can be electrically connected to a semiconductor layer of a second charge carrier type of a further segment via the connecting structure. For example, the semiconductor layer of a first charge carrier type is n-conducting and the semiconductor layer of a second charge carrier type is p-conducting, or vice versa. If the active layer of the respective segment is provided to generate electromagnetic radiation, the segments being connected to one another in series may emit light simultaneously during operation of the component. As a result of the serial interconnection of the segments, the component can be operated with a comparatively higher operating voltage even without a ballast unit, and thus can be formed as a high-voltage LED.

The first segment and the second segment of the semiconductor body may be interconnected in an anti-parallel manner. During operation of the component, one of these segments can thus be configured to generate electromagnetic radiation, while the other segment serves as a protective diode. The segments can have different areas. In particular, the segment provided to generate electromagnetic radiation has a larger area than the segment serving as a protective diode. However, it is also possible for both segments to have for instance the same area so that, in an electrical polarity reversal, the segment used to serve as a protective diode now generates electromagnetic radiation, and vice versa, without substantially affecting the radiation power of the component. By such a configuration, the service life of the component may be overall increased. Furthermore, the connecting of the component is also simplified.

A first segment and a second segment are interconnected in anti-parallel if the segments are connected in parallel to one another such that a p-conducting region of the first segment electrically conductively connects to an n-conducting region of the second segment and, at the same time, an n-conducting region of the first segment electrically conductively connects to the p-conducting region of the second segment. Due to the p-n junctions, the first and the second segments form diodes being interconnected in an anti-parallel manner, for example, by connecting structures, also in the form of conductor tracks.

The semiconductor body can have a plurality of first segments, wherein the first segments are interconnected in series. The plurality of first segments interconnected in series can be connected to one second segment of the semiconductor body in an anti-parallel manner. The semiconductor body can also have a plurality of second segments that are, for example, interconnected in series. The plurality of first segments interconnected in series can be connected in an anti-parallel manner to the plurality of second segments interconnected in series. This means that the component can be formed such that the latter has a plurality of segments interconnected in series and provided to generate radiation, and additionally has a protective diode structure, wherein the protective diode structure is in turn formed by a plurality of segments interconnected in series.

By a plurality of for instance first segments interconnected in series to one another, the operating voltage of the component is further increased. Accordingly, the plurality of for instance second segments interconnected in series among one another can serve as an ESD protective diode for the plurality of first segments, wherein the operating voltage of the component can be adapted to a corresponding number of segments of the ESD protective diode interconnected in series. For example, the semiconductor body has at least three or at least four segments, wherein at least two segments electrically interconnect in series to one another and are configured to generate electromagnetic radiation, and wherein at least one or a plurality of further segments is/are formed as an ESD protective diode and are interconnected to the at least two segments in an anti-parallel manner.

In particular, the component is formed as a high-voltage LED having an operating voltage of at least 3 V, for instance having an operating voltage of 3 V to 24 V. In this case, the semiconductor body can have a plurality of segments interconnected in series that are configured to generate electromagnetic radiation during operation of the component. The component can also be formed as a high-voltage LED having an operating voltage of 24 V to 250 V, or 24 V to 350 V.

The segments may be formed such that, in a plan view of the first main surface of the semiconductor body, an identification of the subregions with respect to their position and/or to their associated electrical polarities is provided by a predetermined design of the segments or by a predetermined design of a separating trench formed between the segments. For example, the segments can be of different sizes. The segments can also have different shapes. The separating trench can also have a specific shape, for example, an asymmetrical shape so that, based on the design of the separating trench, the position or the electrical polarity of the respective subregion of the metal layer can be identified, for example, when viewing on the first main surface or the radiation exit surface of the component. In particular, in a plan view of the first main surface, i.e. in a plan view of a main surface of the semiconductor body facing away from the carrier, the designs/design of the separating trench and/or of the segments are/is apparent, for instance visually apparent from the outside. In other words, the positions or the electrical polarities of the subregions of the metal layer formed as an anode or cathode can thereby be marked on a front side of the component, i.e. on the radiation exit side of the component, via the design of the segments and/or via the design of the separating trench arranged between the segments.

The separating trench can be formed in the lateral direction between the segments and in the vertical direction through the semiconductor body. In particular, in a plan view of the first main surface of the semiconductor body facing away from the carrier, the separating trench has an asymmetrical shape so that an identification of the subregions with regard to their position and/or associated electrical polarities is rendered visible on the basis of the asymmetry. The asymmetry of the separating trench can be realized, for example, by side walls of the separating trench formed differently oblique or by an asymmetrical lateral cross section of the separating trench.

On its side facing away from the carrier, the semiconductor body may comprise a buffer layer having a vanishing electrical transverse conductivity, wherein the segments of the semiconductor body mechanically connect via the buffer layer. The buffer layer can comprise, for instance, a semiconductor material. In particular, the buffer layer is formed as part of the semiconductor body. In this case, the semiconductor body can be formed in a contiguous manner, wherein the segments of the semiconductor body are spatially separated in the lateral direction and are arranged on the common buffer layer. The buffer layer is formed such that—without any further electrical connecting means—different segments, even if they mechanically connect to one another via the buffer layer, are electrically isolated from one another.

The component may have a converter layer on a surface of the semiconductor body facing away from the carrier. The converter layer can contain a converter material suitable to convert electromagnetic radiation of a first peak wavelength into electromagnetic radiation of a second peak wavelength. In particular, during operation of the component, the active layer emits an electromagnetic radiation having the first peak wavelength, wherein the first peak wavelength is smaller than the second peak wavelength converted by the converter layer. The converter material can be embedded in a matrix material such as silicone.

In a method of producing one or a plurality of the components for instance described here, the carrier of the respective component is not produced separately from the associated semiconductor body of the component, but is formed directly on the associated semiconductor body. In the production of a plurality of such components, the mold bodies of the plurality of components can be formed by first applying a plastic material to a semiconductor layer stack to form a contiguous mold body composite. In a separate method step, the semiconductor layer stack can be subdivided into a plurality of semiconductor bodies. The semiconductor bodies can each be further segmented into a plurality of laterally spaced segments, for instance by lateral structuring. To electrically contact the respective semiconductor body and interconnect neighboring segments, the subregions of the metal layer and/or the connecting structure or a plurality of connecting structures can be applied to the respective semiconductor body for instance before or after formation of the mold body composite, for example, by a galvanic coating method.

If the subregions and/or the connecting structure or the plurality of connecting structures are formed after the formation of the mold body composite, openings that uncover electrical connection layers or through-vias can be formed in the mold body composite, wherein the subregions of the metal layer and/or the connecting structures are each formed in the openings and can be electrically conductively connected to the respective semiconductor body via the electrical connection layers or the through-vias.

By singulating the composite, a plurality of components can be formed. The singulated components can each comprise a semiconductor body from the semiconductor layer stack and a carrier having a mold body and a metal layer comprising a first and a second subregion, wherein the mold body arises for instance from the mold body composite.

In the method, the semiconductor body may first be prepared in a contiguous manner on the substrate, for instance on a growth substrate. Prior to formation of the mold body, the semiconductor body can be separated into a plurality of segments, wherein, to separate the segments, at least one separating trench or a plurality of separating trenches is/are formed from a main surface of the semiconductor body facing away from the substrate into the semiconductor body. After formation of the mold body, the growth substrate is preferably removed from the components to be produced.

Alternatively, it is also possible for the semiconductor body to be separated into a plurality of segments after removal of the growth substrate. In this case, to separate the segments at least one separating trench or a plurality of separating trenches can be formed from a main surface of the semiconductor body facing the growth substrate into the semiconductor body. The separating trench can extend through the eventually still present buffer layer, as a result of which the buffer layer can be separated into a plurality of laterally spaced partial buffer layers. The mold body is formed on the semiconductor body preferably prior to removal of the growth substrate, for example, by a casting method.

The method described above is particularly suitable for the production of a component described here. Features described in connection with the component can therefore also be used for the method and vice versa.

Further advantages, preferred structures and further developments of the method as well as of the component will become apparent from the examples explained below in conjunction with the drawings.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

Figure 1A:
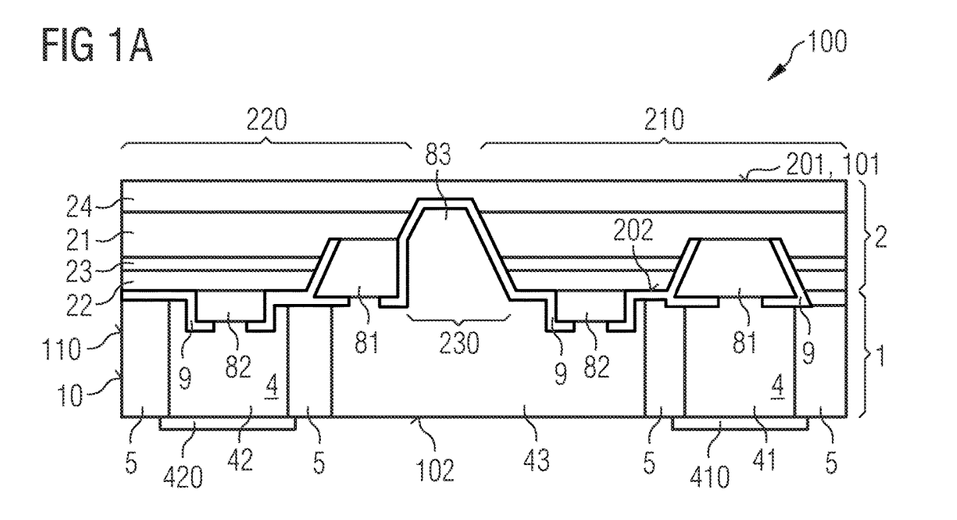

FIG. 1A shows an example of a component 100. The component 100 has a carrier 1 and a semiconductor body 2. The semiconductor body 2 comprises a first main surface 201 facing away from the carrier and a second main surface 202 facing towards the carrier 1. The semiconductor body 2 comprises a first, for instance n-conducting semiconductor layer 21, a second, for instance p-conducting semiconductor layer 22, and an active layer 23 arranged between the semiconductor layers. Alternatively, the first semiconductor layer 21 can be formed in a p-conducting manner and the second semiconductor layer 22 in an n-conducting manner.

The semiconductor body 2 can be formed from a III/V compound semiconductor material. A III/V compound semiconductor material has an element from the third main group such as B, Al, Ga, In, and an element from the fifth main group such as N, P, As. In particular, the term "III/V compound semiconductor material" comprises the group of binary, ternary or quaternary compounds comprising at least one element from the third main group and at least one element from the fifth main group, for example, nitride and phosphide compound semiconductors. Such a binary, ternary or quaternary compound can additionally contain, for example, one or more dopants and additional constituents. In particular, the semiconductor body 2 comprises GaN. In variation from this, the semiconductor body 2 can also be formed from a II/VI compound semiconductor material.

The semiconductor body 2 comprises a buffer layer 24. In FIG. 1A, the buffer layer 24 adjoins the first semiconductor layer 21. The buffer layer 24 can comprise a semiconductor material. In the vertical direction, the buffer layer 24 is arranged in particular between the first semiconductor layer 21 and a growth substrate (not shown here). The buffer layer 24 and the further semiconductor layers of the semiconductor body 2 can be applied to the growth substrate in layers by an epitaxy method, wherein preferably in a subsequent method step, the growth substrate is partially or completely removed from the semiconductor body 2 by a mechanical, thermal method or by a laser lift-off process.

The component 100 has a radiation passage area 101 and a rear side 102 facing away from the radiation passage area. According to FIG. 1A, the radiation passage area 101 is formed by a surface of the buffer layer 24. Deviating therefrom, the radiation passage area 101 can be formed by a surface of the first semiconductor layer 21 and/or can be structured. In particular, the radiation generated by the active layer 23 is coupled out from the component 100 at the radiation passage area 101. The component can also have a converter layer (not shown here) on the radiation passage area. To apply the converter layer to the radiation passage area, various suitable methods can be used such as sedimentation, dam & fill, coating such as spray coating or EPD (electrophoretic deposition), and others. The converter layer can also be formed as a ceramic converter. The converter material can be embedded, for example, in a ceramic layer. It is also possible for a closing passivation, for example, an electrically insulating layer, to be arranged in the vertical direction between the converter layer and the semiconductor body 2.

The carrier 1 has a mold body 5 and a metal layer 4 that electrically contacts the semiconductor body 2. The metal layer 4 comprises a first subregion 41 and a second subregion 42 for instance assigned to different electrical polarities of the component. The first subregion 41 and the second subregion 42 each extend in the vertical direction throughout the mold body 5. The carrier 1 has a front side in particular facing towards the semiconductor body 2 and a rear side facing away from the semiconductor body 2. The front side and the rear side of the carrier 1 are each formed in places by surfaces of the mold body 5 and in places by surfaces of the metal layer 4, for instance by surfaces of the subregions 41 and 42. In the vertical direction, the subregions 41 and 42 thus extend for instance from the rear side of the carrier 1 as far as the front side of the carrier 1. The rear side 102 of the component is formed at least in places by the rear side of the carrier 1.

To electrically contact the semiconductor body 2, the component 100 comprises a wiring structure 8. The wiring structure 8 can comprise one or a plurality of through-vias 81 and one or a plurality of connection layers 82. In particular, the first subregion 41 is connected to the first semiconductor layer 21 via the through-via 81. The through-via 81 extends in the vertical direction in particular throughout the second semiconductor layer 22 and the active layer 23 into the first semiconductor layer 21. The through-via 81 has a lateral cross section that tapers along the vertical direction from the second main surface 202 to the first main surface 201. Deviating therefrom, it is also possible for the lateral cross section to remain constant along the vertical direction or to increase from the second main face 202 towards the first main face 201. The second subregion 42 is electrically connected to the second semiconductor layer 22, for instance via the connection layer 82. In particular, the connection layer 82 adjoins the second semiconductor layer 22 and for instance simultaneously adjoins the second subregion 42 of the metal layer 4. The wiring structure 8 is illustrated in a simplified manner in FIG. 1A. Deviating therefrom, the wiring structure can comprise, for example, a mirror layer, a current spreading layer and/or further elements.

For example, the subregions 41 and 42 of the metal layer 4 are formed to be electrically connectable on the rear side 102 of the component 100 or of the carrier 1. This means that the subregions 41 and 42 on the rear side 102 can be electrically connected for instance directly or indirectly to an external electrical voltage source. In FIG. 1A, the subregions 41 and 42 are each covered by a contact layer 410 or 420 formed in particular as a soldering layer or a protective layer and contains, for example, a noble metal. The contact layer can contain, for example, gold and/or palladium, Ag, Sn, Cu, Ni and/or Pt. In particular, the contact layer is a CuSn, NiSn, CuNiSn, TiAu, TiPtAu, NiAu, TiAuSn or NiPdAu layer. The contact layer can also comprise a SnAgCu layer (SAC solder layer), AuSn, CuAgNi layer or a pure Ag, Cu or Au layer.

On the rear side 102, the first subregion 41 and the second subregion 42 are each completely covered, for example, by a first contact layer 410 and a second contact layer 420, respectively. The metal layer 4 can comprise a metal, for example, copper, nickel, or consist of copper or nickel. By virtue of the complete covering of the subregions 41 and 42 by the contact layers 410 and 420 on the rear side 102, the metal layer 4 is protected in particular against external environmental influences such as oxygen or liquids as a result of which a possible oxidation of the metal layer 4 on the rear side 102 is prevented.

FIG. 1A shows a segmented semiconductor body 2 of the component 100. The semiconductor body 2 has a first segment 210 and a second segment 220. The segments 210 and 220 are constructed in the same manner and each comprise the first semiconductor layer 21, the second semiconductor layer 22 and the active layer 23. In FIG. 1A, the segments 210 and 220 are mechanically connected via the buffer layer 24. In this case, the buffer layer 24 can be formed in a contiguous manner and, in a plan view of the carrier 1, can completely cover the first segment 210 and the second segment 220. The buffer layer 24 is formed to be electrically insulating in particular along lateral directions. This means that the buffer layer has for instance a vanishing transverse conductivity. Without any further electrical connecting means, the semiconductor body 2 is thus divided into a plurality of segments 210 and 220 each being laterally spaced apart and electrically isolated from one another, even if they each adjoin the buffer layer 24, which is formed in a contiguous manner and, in a plan view of the carrier 1, can completely cover the segments. In other words, the buffer layer 24 does not count in particular as an integral part of the segments 210 and 220. The semiconductor body 2 can comprise a plurality of such first segments 210 and/or a plurality of such second segments 220.

For segmentation of the semiconductor body 2, one or a plurality of separating trench/trenches 230 is/are formed in the semiconductor body 2, for instance by an etching method. The respective separating trench 230 can be formed such that the latter extends in the vertical direction from the second main surface 202 of the semiconductor body 2 throughout the second semiconductor layer 22, the active layer 23 and the first semiconductor layer 21 of the semiconductor body 2 for instance into the buffer layer 24. In particular, formation of the separating trench 230 or the plurality of separating trenches 230 is carried out prior to removal of the growth substrate. After removal of the growth substrate, the buffer layer 24 can still be formed in a contiguous manner or comprise a plurality of separate partial buffer layers.

To electrically interconnect the segments 210 and 220, the component 100 has one or a plurality of connecting structure/structures 43. The connecting structure 43 or the plurality of connecting structures 43 can be formed such that two adjacent segments of the semiconductor body 2 are interconnected to one another in series, in parallel or in an anti-parallel manner via the connecting structure 43 or the plurality of connection structures. The connecting structure 43 comprises, for example, a metal such as copper. In particular, the subregions 41 and 42 and the connecting structure 43 can be of the same metal. The subregions 41 and 42 of the metal layer 4 and the connecting structure 43 or the plurality of connecting structures 43 are arranged on the same side of the semiconductor body 2. In a plan view, they are expediently free of overlaps. In particular, the subregions 41 and 42 and also the connecting structure 43 or the plurality of connecting structures 43 are formed on the semiconductor body 2 in one single method step, for instance by a coating method, for example, by a galvanic method. In this case, the connecting structure 43 can partially or completely fill the separating trench 230. In a plan view of the semiconductor body 2, the connecting structure 43 can completely cover the separating trench 230 and project beyond side surfaces of the separating trench 230 in the lateral direction. The connecting structure 43 can overlap with both adjacent segments of the semiconductor body 2. The component 100 can have a plurality of such connecting structures 43.

The carrier 1 has a mold body 5. The mold body 5 is in particular a casted body. This means that the mold body 5 is formed, for example, by a casting method. In FIG. 1A, the subregions 41 and 42 and the connecting structure 43 are each completely surrounded by the mold body 5 in the lateral directions. By the mold body 5 formed in particular in a contiguous manner, the subregions 41 and 42 and the connecting structure 43 are held together. The connecting structure 43 can thus act as an integral part of the carrier 1 and thus contributes to the mechanical stabilization of the component 100. Via the connecting structure 43, a semiconductor layer of one segment electrically connects to a semiconductor layer of another segment. In FIG. 1A, the connecting structure 43 connects the connection layer 82 associated with the first segment 210 to the through-via 81 associated with the second segment 220.

According to FIG. 1A, the connecting structure 43 is formed such that it extends throughout the mold body 5. The rear side 102 of the component 100 can be formed in places by a surface of the connecting structure 43. The connecting structure 43 has a subregion 83 that fills the separating trench 230 and thus extends throughout the second semiconductor layer 22, the active layer 23 and the first semiconductor layer 21 of the semiconductor body 2 into the buffer layer 24.

The component 100 has an insulating structure 9. The insulating structure 9 is arranged for instance between the semiconductor body 2 and the carrier 1. The insulating structure 9 can extend along the vertical direction in places into the semiconductor body 2 so that the through-vias 81 are electrically isolated from the second semiconductor layer 22 and from the active layer 23 in lateral directions. In addition, by the insulating structure 9, the subregions 41 and 42 as well as the connecting structure 43 are void of a direct physical contact to the semiconductor layers of the semiconductor body 2. In FIG. 1A, the insulating structure 9 comprises a plurality of openings to expose the connection layers 82 and the through-vias 81. In FIG. 1A, lateral side surfaces of the connection layers 82 and/or of the through-vias 81 are completely covered by the insulating structure 9. Apart from this, it is also possible for the side surfaces of the connection layers 82 and/or of the through-vias 81 to be covered only partially by the insulating structure 9 so that the connection layers 82 and/or the through-vias 81 are electrically conductively connected, for instance on their side surfaces, directly to the first subregion 41 or the second subregion 42 or the connecting structure 43.

The carrier 1 according to FIG. 1A has side surfaces 10 formed for instance exclusively by surfaces of the mold body 5. The component 100 has side surfaces 110 partially formed by side surfaces 10 of the carrier 1. In contrast to FIG. 1A, the semiconductor body 2 can likewise be covered by a material of the mold body 5 in lateral directions. For example, the mold body 5 can be formed such that the latter extends in the vertical direction as far as the buffer layer 24 so that the semiconductor body 2 is surrounded by the mold body 5 in lateral directions.

Figure 1B:
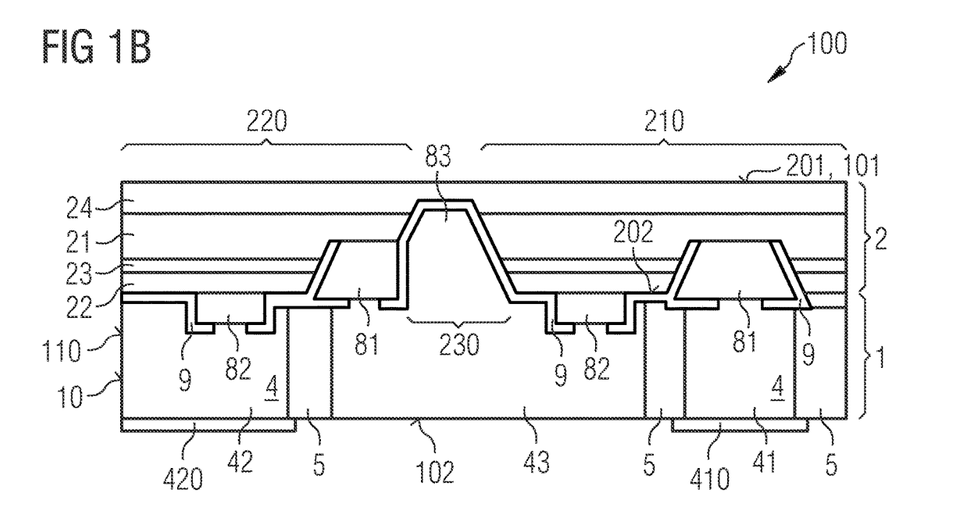

FIG. 1B shows a further example of a component 100. This example substantially corresponds to the example illustrated in FIG. 1A. In contrast thereto, the carrier 1 can be formed such that at least one side surface 10 is formed in places by a surface of the second subregion 42. The second subregion 42 can thus be electrically contacted also via the side surface 10 of the carrier 1.

Figure 2A:
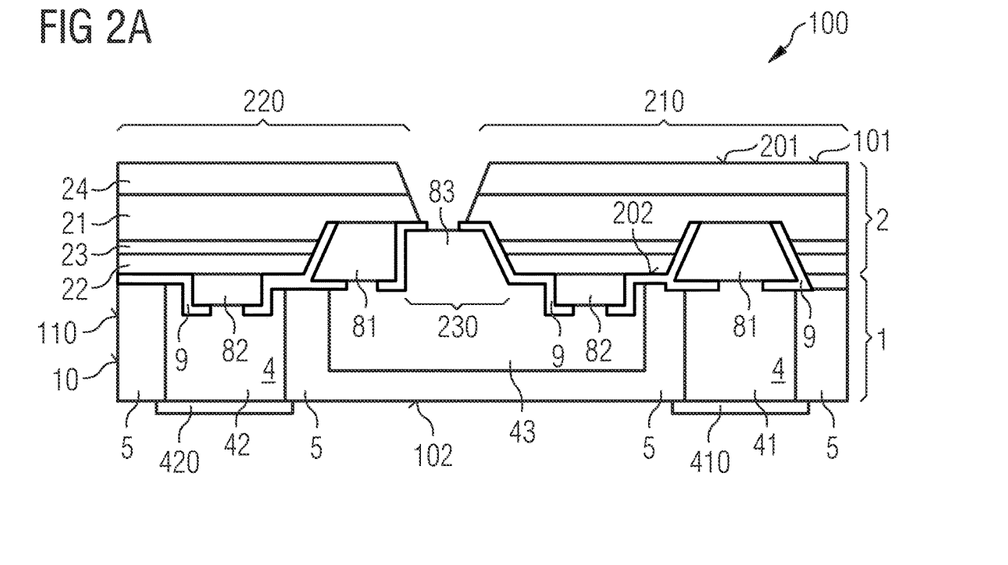

FIG. 2A shows a further example of a component 100 substantially corresponding to the example illustrated in FIG. 1A. In contrast to this, the connecting structure 43 is formed such that the rear side 102 of the carrier or of the component 100 is free from a surface of the connecting structure 43. In other words, the mold body 5 is applied to the semiconductor body 2 such that, in a plan view of the semiconductor body 2, the mold body 5 completely covers the connecting structure 43. The surfaces of the subregions and of the connecting structure facing away from the semiconductor body 2 are thus situated on two different levels along the vertical direction. Furthermore, in contrast to FIG. 1A, the separating trench 230 is formed such that the separating trench 230 extends through the entire semiconductor body 2. The separating trench 230 can be formed, for example, after the growth substrate has been removed. In this case, the growth substrate can be removed from the semiconductor body 2 after formation of the mold body 5. To form the segments 210 and 220 that are electrically separated from one another, the separating trench 230 and/or a plurality of separating trenches 230 can be formed starting from the radiation passage area 101 of the component 100 into the semiconductor body 2. As a result of formation of the separating trench 230, the connecting structure 43 can be partially exposed in the region of the separating trench 230.

As a result of the formation of the separating trench 230 or of the plurality of separating trenches 230, the semiconductor body 2 can be subdivided into segments of different shaping, for instance of different sizes or shapes so that, in a plan view of the radiation passage area 101, an identification of the subregions 41 and 42 with respect to their positions and/or their associated electrical polarities is provided. Alternatively or additionally, such identification can be provided by shaping of the separating trench 230. In particular, the separating trench 230 can have a predetermined shape, by which, in a plan view of the radiation passage area 101, an identification of the subregions 41 and 42 with respect to their position and/or electrical polarities is apparent, in particular visually apparent. In FIG. 2A, the separating trench 230 has a symmetrical shape, whose cross section is continuously growing along the vertical direction from the connecting structure 43 towards the radiation passage area 101.

Figure 2B:
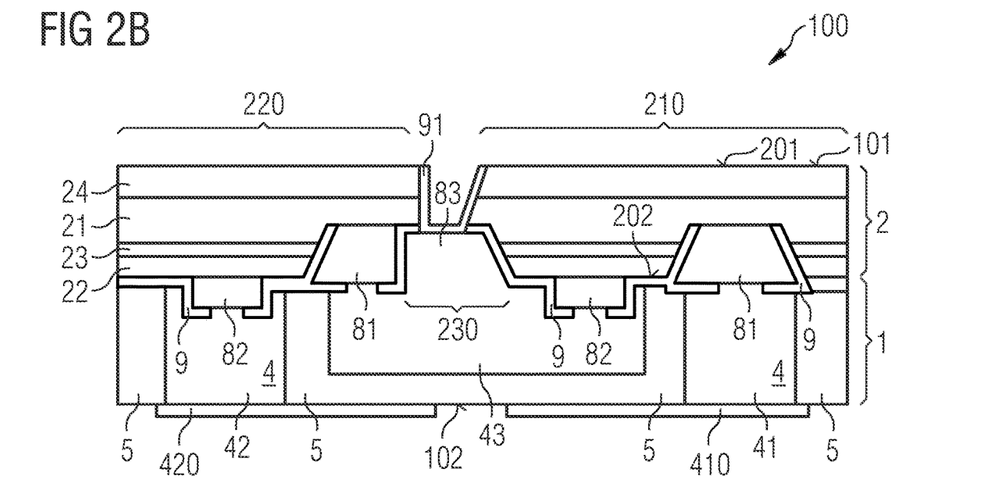

FIG. 2B shows a further example of a component 100 substantially corresponding to the example illustrated in FIG. 2A. In contrast thereto, the separating trench 230 has an asymmetrical shape. Furthermore, the separating trench 230 can be covered, in particular completely covered, by a passivation layer 91. On the basis of the asymmetry of the separating trench, for instance the electrical polarities of the subregions 41 and 42 on the rear side 102 of the component can be identified. In FIG. 2B, the trench 230 has an inner wall running perpendicular to the radiation passage area 101 and an inner wall running oblique to the radiation passage area 101. Due to the different orientations of the inner walls of the separating trench 230 and the resulting asymmetric cross section of the separating trench 230, for instance by definition it can be identified from the outside, whether on the rear side 102 of the component, the p-type polarity of the component 100 is located for instance on the side of the vertical sidewall and the n-type polarity of the component 100 is located for instance on the side of the oblique inner wall of the separating trench 230. In contrast to FIG. 2A, the contact layers 410 and 420 are formed such that they can cover both the connecting structure 43 and the first subregion 41 or the second subregion 42. The contact layers 410 and 420 together can cover a major part of the rear side 102 of the component 100, for instance more than 50%, for example, at least 70% or at least 80% of the rear side 102.

In FIGS. 1A to 2B, the first segment 210 and the second segment 220 electrically connect in particular in series. The second semiconductor layer 22 of the first segment 210 electrically connects to the first semiconductor layer 21 of the second segment 220 via the connecting structure 43. If both the active layer 23 of the first segment 210 and the active layer 23 of the second segment 220 are provided to generate electromagnetic radiation, on account of the series connection, the first segment 210 and the second segment 220 can generate light at a comparatively higher operating voltage. In other words, the component 100 can be operated at a comparatively higher electrical voltage on account of the series connection of the segments of the semiconductor body 2. In contrast to FIGS. 1A to 2B, the component 100 comprises a plurality of first and/or second segments so that more than two segments, for example, at least three or at least 5 or at least 10 segments, can be electrically interconnected in series, as a result of which the component is formed, for example, as a high-voltage LED. Such component can be operated, for instance, at an operating voltage of at least 3 V, 5 V, 12 V, 24 V, 50 V to for instance 250 V or 350 V. In a plan view, the segments 210 and 220 can have identical or different areas.

Figure 3A:
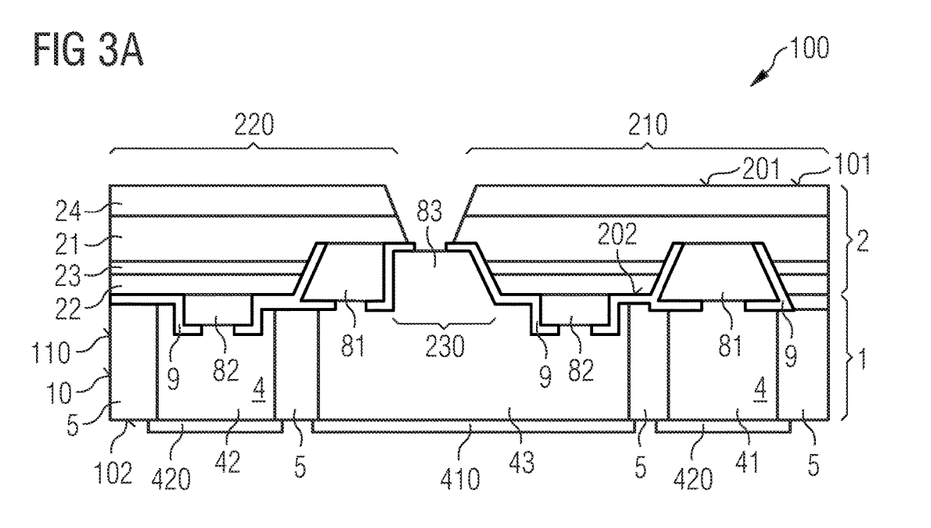

FIG. 3A shows a further example of a component 100. This example substantially corresponds to the example illustrated in FIG. 2A. In contrast thereto, the segments 210 and 220 of the semiconductor body 2 electrically conductively connect to one another via the connecting structure 43 or via the plurality of connecting structures 43 such that the segments 210 and 220 are interconnected in anti-parallel. In particular, the first segment 210 and the second segment 220 are each formed as a diode.

For the anti-parallel connection of the segments 210 and 220, the second semiconductor layer 22 of the first segment 210 electrically connects to the first semiconductor layer 21 of the second segment 220, for instance via the connection layer 82 associated with the first segment 210, the connecting structure 43, and the through-via 81 associated with the second segment 220. The first semiconductor layer 21 of the first segment 210 can electrically conductively connect to the second semiconductor layer 22 of the second segment 220, for instance by the through-via 81 associated with the first segment 210, the first subregion 41, the second subregion 42, and the connection layer 82 associated with the second segment 220. The first subregion 41 and the second subregion 42 may be assigned to the same electrical polarity of the component 100. These subregions 41 and 42 are electrically connectable by a further connecting structure 43 or via a conductor track (not shown here in FIG. 3A) or via the second contact layer 420. In particular, the first semiconductor layers 21 of the segments 210 and 220 are formed in an n-conducting manner and the second semiconductor layers 22 of the segments 210 and 220 in a p-conducting manner, or vice versa.

Deviating from FIG. 3A, it is also possible that the component 100 comprises two connecting structures 43 for the anti-parallel connection of the segments 210 and 220, wherein a first connecting structure 43—as shown for instance in FIG. 3A—electrically conductively connects the second semiconductor layer 22 of the first segment 210 to the first semiconductor layer 21 of the second segment 220, and a further connecting structure 43 (not illustrated here) electrically conductively connects the first semiconductor layer 21 of the first segment 210 to the second semiconductor layer 22 of the second segment 220. The first segment 210 and the second segment 220 can each be assigned to two connection layers 82 and at least to two through-vias 81. Furthermore, the subregions 41 and 42 illustrated in FIG. 3A can be configured to electrically contact the entire semiconductor body 2 and thus can be assigned to different electrical polarities. In contrast to FIG. 3A, the two connecting structures 43 mentioned here can be formed as in FIGS. 2A and 2B so that the rear side 102 of the carrier 1 or of the component 100 is free of surfaces of the connecting structures.

Figure 3B:
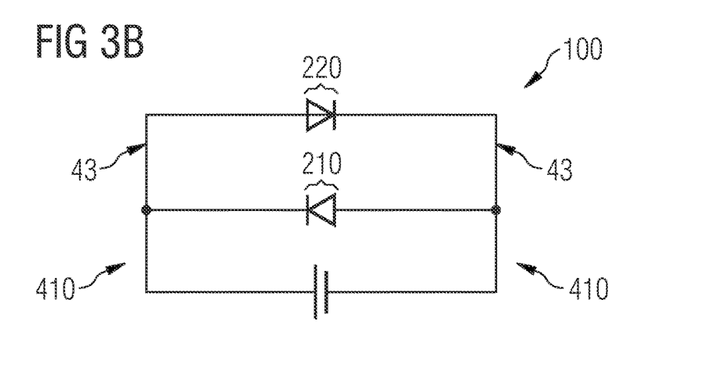
FIGS. 3B and 3C each show a schematic structure of different examples for a component.

FIG. 3B shows a schematic circuit diagram of the component 100, in which two segments 210 and 220 are interconnected in anti-parallel. The first segment 210 and the second segment 220 are each formed as diodes and interconnected to one another in anti-parallel, for example, by connecting structures 43, also in the form of conductor tracks 43. The component 100 can be electrically contacted with an external voltage source via the first contact layer 410 and the second contact layer 420 that are arranged for instance on the rear side 102 of the component and are electrically conductively connected to the first subregion 41 or to the second subregion 42 or to the connecting structure 43.

Figure 3C:
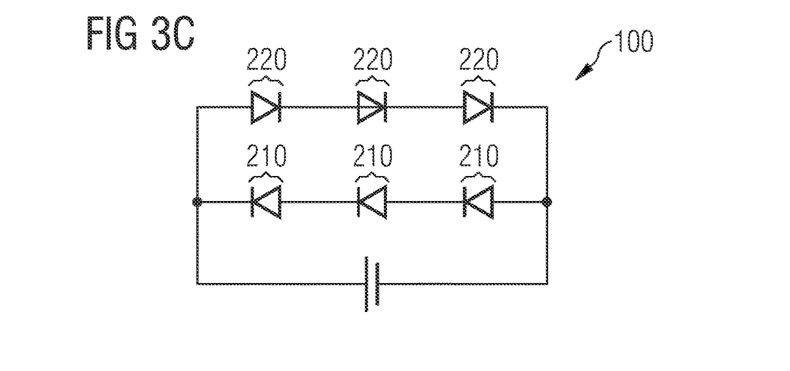

The example of a component 100 illustrated in FIG. 3C substantially corresponds to the example illustrated in FIG. 3B. In contrast thereto, the component 100 has a plurality of first segments 210 connected in series and a plurality of second segments 220 connected in series. The plurality of first segments 210 further connect to the plurality of second segments 220 in an anti-parallel manner. Due to the anti-parallel connection of different segments 210 and 220 of the semiconductor body 2, during operation of the component 100, a segment or a plurality of segments can emit electromagnetic radiation while one further segment or a plurality of further segments acts/act for instance as an ESD protective diode for the component 100 or as a protective diode structure made of a plurality of ESD protective diodes interconnected in series. The number of the segments provided to generate light is preferably greater than the number of the segments provided to form the ESD protective diodes. On account of the plurality of segments interconnected in series and acting as protective diodes, even at a particularly high operating voltage, a sufficient protection of the component 100 against electrostatic discharges can be achieved.

FIGS. 4A to 4G show different configuration variants of a component 100 in a plan view of the rear side 102.

Figure 4A:
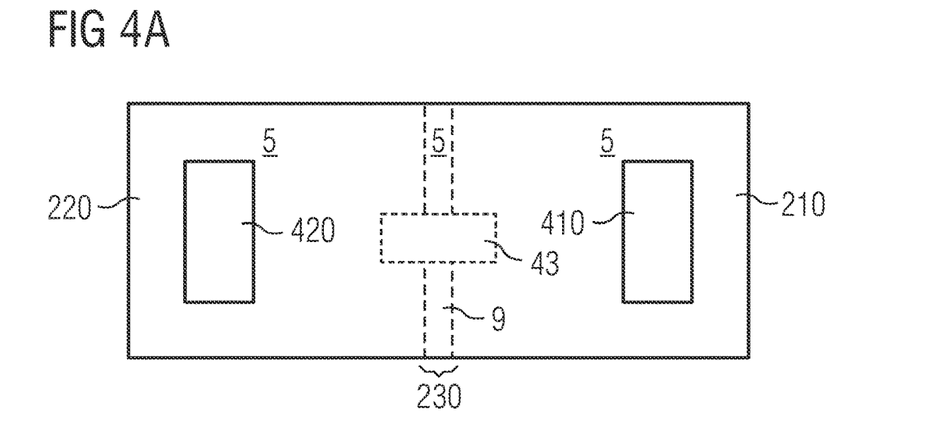
FIGS. 4A to 4G show schematic illustrations of further examples for a component in a plan view of the rear side of the component.

FIG. 4A shows a component 100 having two segments 210 and 220 interconnected in series via a connecting structure 43. The component 100 has the first contact layer 410 and the second contact layer 420 on the rear side 102, which completely cover for instance the first subregion 41 and the second subregion 42. The mold body 5 completely covers the connecting structure 43 and the separating trench 230. Without the connecting structure 43, the first segment 210 is electrically isolated from the second segment 220, for instance by the insulating structure 9 that covers the separating trench 230 at least partially or completely. The component 100 according to FIG. 4A is formed, for example, as a dual junction LED.

Figure 4B:
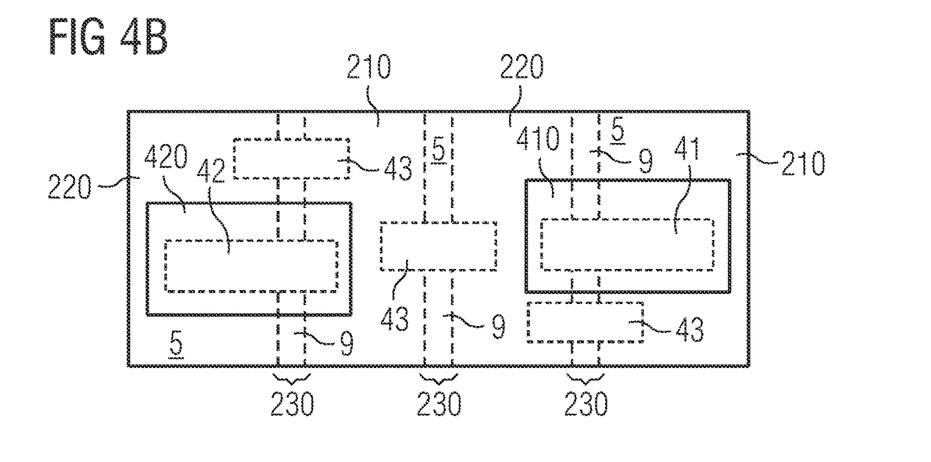

The component illustrated in FIG. 4B comprises a plurality of segments, in this case four segments, interconnected in series for instance by a plurality of connecting structures 43, in this case three connecting structures 43. The separating trenches 230 arranged between adjacent segments are formed such that they are oriented parallel to one another in the lateral direction. The subregions 41 and 42 are provided to electrically contact, in particular to externally electrically contact the component 100. The subregions 41 and/or 42 can each be formed such that they have overlaps with two or more segments. In FIG. 4B, in a plan view, the subregions 41 and 42 each have overlaps with two adjacent segments 210 and 220. The subregions 41 and 42 can each laterally bridge at least one separating trench 230.

The first subregion 41 can electrically conductively connect to the first semiconductor layer 21 of the component 100 via one through-via 81 (for instance as illustrated in FIG. 1A). The first subregion 41 can be electrically insulated from the adjacent segment 220. The electrical connection between the mutually adjacent segments 210 and 220 is furthermore preferably effected by the connecting structure 43 as can be seen, for example, in FIG. 4B, where the connecting structure 43 bridges a separating trench arranged between the adjacent segments 210 and 220. The second subregion 42 can be formed analogously to the first subregion 41, with the difference, however, that the second subregion 42 can electrically conductively connect to the second semiconductor layer 22 of the component, for instance by a connection layer 82 (as shown, for example, in FIG. 1A). In a plan view, the subregions 41 and 42 can be completely covered by the contact layers 410 and 420.

Figure 4C:
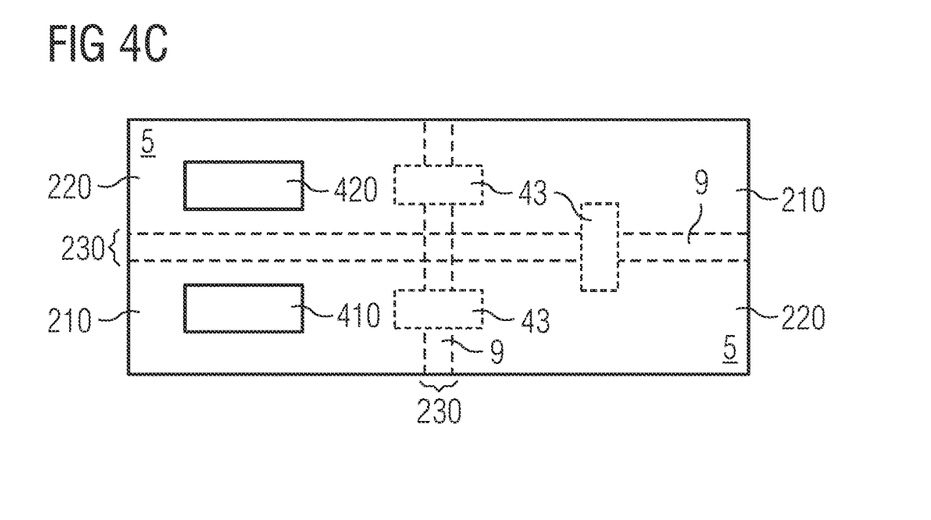

The component illustrated in FIG. 4C has four segments 210 and 220 interconnected in series by three connecting structures 43. The four segments are spatially and thus electrically separated from one another by two intersecting separating trenches 230. The component 100 according to FIG. 4B or 4C is formed for instance as a multi junction LED.

Figure 4D:
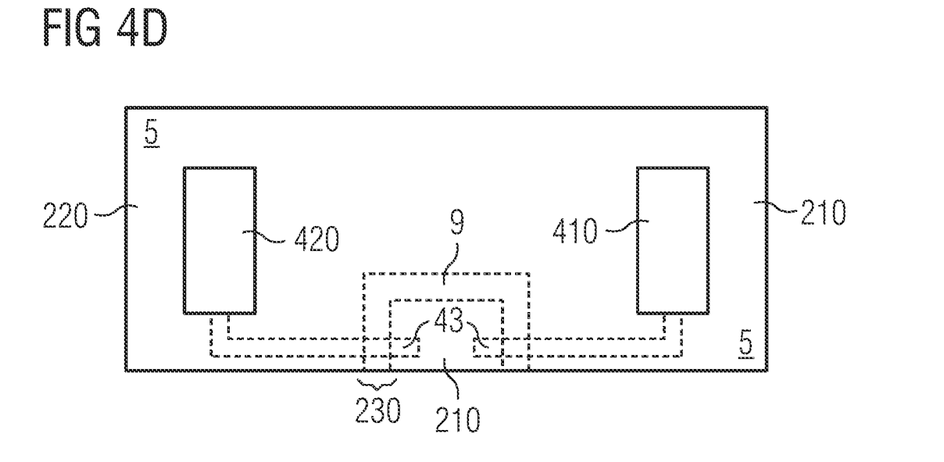

FIG. 4D shows a component 100 having a semiconductor body 2 comprising a first segment 210 and a second segment 220, wherein the segments 210 and 220 interconnect in anti-parallel via the connecting structures 43. It is possible for the connecting structures 43 to be formed, for example, as conductor tracks. In FIG. 4D, the semiconductor body 2 has a U-shaped separating trench 230 arranged on the edge side and encloses the first segment 210 in lateral directions. The separating trench 230 can also have other, for instance closed, shapes. A schematic circuit diagram of this component is illustrated, for example, in FIG. 3B. The first segment 210 is formed, in particular, as an ESD protective diode. This segment 210 electrically connects for instance in the reverse-biased direction. During operation of the component 100, the second segment 220 electrically connects in the forward-biased direction and can be configured to generate electromagnetic radiation. The second segment 220 can have an area larger than an area of the first segment. For example, the area of the second segment 220 is at least five times, at least ten times or at least twenty times as large as the area of the first segment 210, which is configured as an ESD protective diode.

Figure 4E:
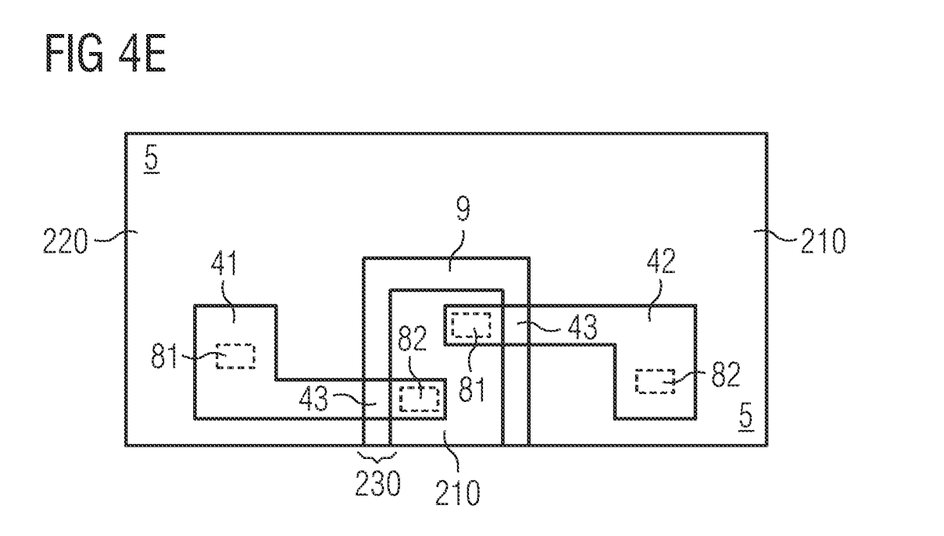

The example of a component illustrated in FIG. 4E substantially corresponds to the example illustrated in FIG. 4D. In contrast thereto, it is schematically illustrated that the connecting structure 43 can adjoin the first subregion 41 or the second subregion 42 or can be formed as part of one of the subregions 41 or 42. If the connecting structure 43 is formed as part of the first subregion 41 or of the second subregion 42, the first subregion 41 or the second subregion 42 can bridge a separating trench arranged between the segments 210 and 220.

In FIG. 4E, in a plan view, the subregions 41 and 42 comprising the connecting structures 43 have overlaps both with the first segment 210 and the second segment 220. The first subregion 41 electrically connects to the first semiconductor layer 21 of the second segment 220, for example, via the through-via 81, and to the second semiconductor layer 22 of the first segment 210 via its associated connecting structure 43 and the connection layer 82. The second subregion 42 electrically connects to the second semiconductor layer 22 of the second segment 220, for instance, via a further connection layer 82, and to the first semiconductor layer 21 of the first segment 210 via its associated connecting structure 43 and a further through-via 81. The component is externally electrically connectable via subregions 41 and 42. In contrast to FIG. 4B, the subregions 41 and 42 are configured both for the external contacting of the component 100 and for the electrical connection between two adjacent segments 210 and 220. A schematic circuit diagram of this component is illustrated, for example, in FIG. 3B.

Figure 4F:
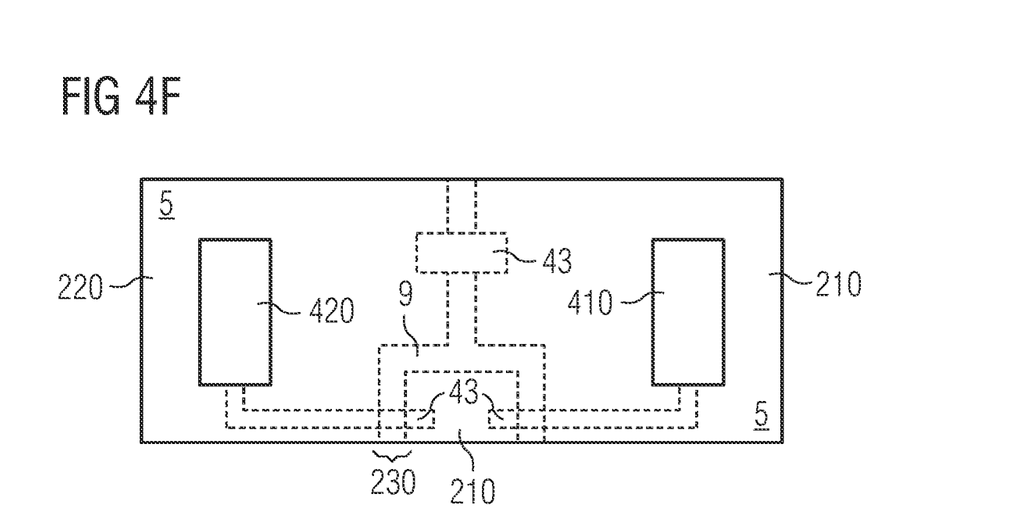

The example of a component illustrated in FIG. 4F substantially corresponds to the example illustrated in FIG. 4D. In contrast thereto, the component comprises two segments 210 and 220 interconnected in series via the connecting structure 43 and configured to generate electromagnetic radiation during operation of the component. Moreover, these two segments are interconnected to a further segment in an anti-parallel manner, wherein, during operation of the component 100, the further segment serves as an ESD protective diode.

Figure 4G:
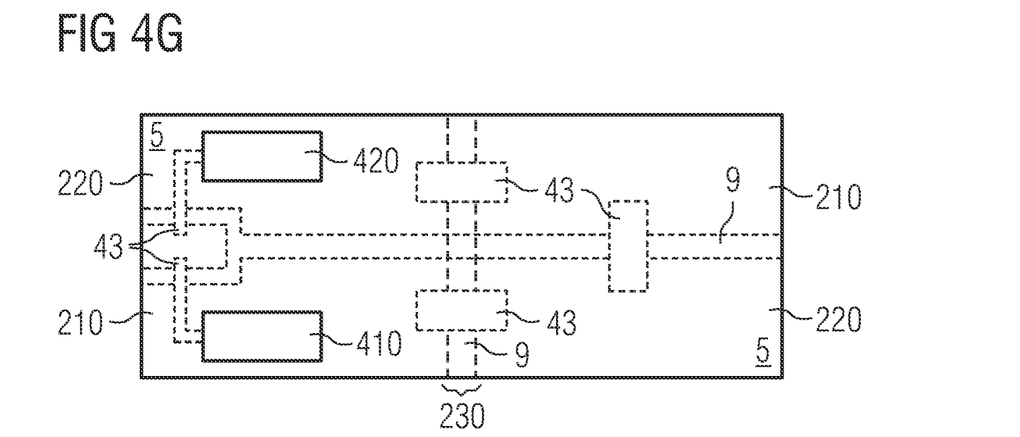

The example illustrated in FIG. 4G substantially corresponds to the example illustrated in FIG. 4C having four segments interconnected in series, wherein the four segments of the component are interconnected in anti-parallel to a further segment, which acts as an ESD protective diode for the component. The component 100 according to FIGS. 4D to 4G is formed in particular as an LED device having an integrated protective diode.

This application claims priority of DE 10 2015 111 558.1, the subject matter of which is incorporated herein by reference.

Our components and methods are not restricted to the examples by this description made with reference to examples. This disclosure rather comprises any novel feature and any combination of features, including in particular any combination of features in the appended claims, even if the feature or combination is not itself explicitly indicated in the claims or examples.

The invention claimed is:

1. A component formed as a high-voltage LED having an operating voltage of 24 volts to 350 volts and comprising a carrier and a semiconductor body arranged on the carrier, wherein the semiconductor body has a plurality of first segments and a plurality of second segments, and the segments are constructed in the same manner and each have a first semiconductor layer facing away from the carrier, a second semiconductor layer facing towards the carrier, and an active layer arranged in a vertical direction between the first and the second semiconductor layers, the carrier comprises a mold body made of an electrically insulating plastic material and a metal layer, wherein the metal layer comprises a first subregion and a second subregion, and at least one of the subregions extends in the vertical direction through the mold body to electrically contact the semiconductor body, the first and second segments are spatially separated from one another in a lateral direction and electrically conductively connect to one another via a connecting structure, wherein the connecting structure, the first subregion and the second subregion adjoin the mold body and are arranged on the same side of the semiconductor body, the first segments are interconnected in series and are configured to generate electromagnetic radiation during operation of the component, the second segments are interconnected in series and overall act as an ESD protective diode, and the first segments and the second segments are interconnected to one another in an anti-parallel manner.

2. The component according to claim 1, wherein the connecting structure, the first subregion and the second subregion, in a plan view, are free of overlaps.

3. The component according to claim 1, wherein the connecting structure adjoins one of the subregions or is formed as part of one of the subregions.

4. The component according to claim 1, wherein the mold body is a contiguous casted body formed directly on the semiconductor body, said casted body holding together the connecting structure and the subregions of the metal layer, and the connecting structure, the first subregion and the second subregion are held together by the mold body such that the connecting structure is formed as an integral part of the carrier and contributes to the mechanical stabilization of the component.

5. The component according to claim 1, wherein the mold body and the connecting structure are formed such that the mold body has a rear surface facing away from the semiconductor body, said rear surface being free from a surface of the connecting structure.

6. The component according to claim 1, wherein the active layer of the first segment and the active layer of the second segment are formed as p-n junction zones, and the first segment and the second segment electrically interconnect in series via the connecting structure.

7. The component according to claim 1, wherein the first segment and the second segment of the semiconductor body are interconnected in an anti-parallel manner so that during operation of the component one of these segments is configured to generate electromagnetic radiation and the other segment serves as an ESD protective diode.

8. The component according to claim 1, wherein the semiconductor body comprises at least three segments, and at least two segments electrically interconnect in series and at least one of the segments is formed as an ESD protective diode and interconnects to the at least two segments in an anti-parallel manner.

9. The component according to claim 1, wherein the semiconductor body comprises a plurality of first segments interconnected in series to one another and a plurality of second segments interconnected in series to one another, and the plurality of first segments interconnect to the plurality of second segments in an anti-parallel manner.

10. The component according to claim 1, formed as a high-voltage LED having an operating voltage of at least 3 volts, wherein the semiconductor body comprises a plurality of segments interconnected in series and configured to generate electromagnetic radiation during operation of the component.

11. The component according to claim 1, wherein at least one separating trench is formed in the lateral direction between the segments and in the vertical direction throughout the semiconductor body, and, in a plan view of a main surface of the semiconductor body facing away from the carrier, the separating trench has an asymmetrical shape so that an identification of the subregions with regard to their positions and/or associated electrical polarities is rendered visible on the basis of the asymmetry.

12. The component according to claim 1, wherein, on a side facing away from the carrier, the semiconductor body comprises a buffer layer having a vanishing electrical transverse conductivity, and the segments of the semiconductor body mechanically connect to one another via the buffer layer.

13. A component comprising a carrier and a semiconductor body arranged on the carrier, wherein
the semiconductor body has at least a first segment and a second segment, and the segments are constructed in the same manner and each have a first semiconductor layer facing away from the carrier, a second semiconductor layer facing towards the carrier, and an active layer arranged in a vertical direction between the first and the second semiconductor layers, the carrier comprises a mold body made of an electrically insulating plastic material and a metal layer, the metal layer comprising a first subregion and a second subregion, and at least one of the subregions extending in the vertical direction through the mold body to electrically contact the semiconductor body, the first and second segments are spatially separated from one another in a lateral direction and electrically conductively connect to one another via a connecting structure, wherein the connecting structure, the first subregion and the second subregion adjoin the mold body and are arranged on the same side of the semiconductor body, and an identification of the subregions with respect to their positions and/or their associated electrical polarities is realized by one of:

i. the segments are formed such that, in a plan view of a main surface of the semiconductor body, the identification of the subregions with respect to their positions and/or their associated electrical polarities is provided by a predetermined design of the segments or by a predetermined design of a separating trench formed between the segments, or ii. at least one separating trench is formed in the lateral direction between the segments and in the vertical direction throughout the semiconductor body, and, in a plan view of a main surface of the semiconductor body facing away from the carrier, the separating trench has an asymmetrical shape so that the identification of the subregions with regard to their positions and/or associated electrical polarities is rendered visible on the basis of the asymmetry.

14. A method of producing one or a plurality of the components, each component comprising a carrier and a semiconductor body arranged on the carrier, wherein the semiconductor body has at least a first segment and a second segment, and the segments are constructed in the same manner and each have a first semiconductor layer facing away from the carrier, a second semiconductor layer facing towards the carrier, and an active layer arranged in a vertical direction between the first and the second semiconductor layers, the carrier comprises a mold body made of an electrically insulating plastic material and a metal layer, wherein the metal layer comprises a first subregion and a second subregion, and at least one of the subregions extends in the vertical direction through the mold body to electrically contact the semiconductor body, the first and second segments are spatially separated from one another in a lateral direction and electrically conductively connect to one another via a connecting structure, and the connecting structure, the first subregion and the second subregion adjoin the mold body and are arranged on the same side of the semiconductor body, the method comprising:

the carrier is formed on the semiconductor body and not produced separately from the semiconductor body, the semiconductor body is first formed on a growth substrate in a contiguous manner, prior to removal of the growth substrate, the mold body is formed on the semiconductor body, and after removal of the growth substrate, the semiconductor body is separated into a plurality of segments, wherein, to separate the segments, at least one separating trench is formed from a main surface of the semiconductor body facing the growth substrate into the semiconductor body.

15. The method according to claim 14, wherein the semiconductor body is first formed on a growth substrate in a contiguous manner and separated into a plurality of segments prior to formation of the mold body, wherein, to separate the segments, at least one separating trench is formed from a main surface of the semiconductor body facing away from the growth substrate into the semiconductor body.

16. The method according to claim 14, wherein the mold body is applied to the semiconductor body by a casting method.

17. The method according to claim 14, wherein the connecting structure and/or the metal layer having the first and second subregions are/is applied to the semiconductor body by a galvanic coating method.

* * * * *